(12) United States Patent
Jiang et al.

(10) Patent No.: US 10,622,584 B2
(45) Date of Patent: Apr. 14, 2020

(54) DISPLAY PANEL, PACKAGING METHOD THEREOF AND OLED DISPLAY APPARATUS

(71) Applicants: BOE TECHNOLOGY GROUP CO., LTD., Beijing (CN); Chengdu BOE Optoelectronics Technology Co., Ltd., Beijing, MN (US)

(72) Inventors: Zhiliang Jiang, Beijing (CN); Shilong Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 16/126,643

(22) Filed: Sep. 10, 2018

(65) Prior Publication Data
US 2019/0305244 A1    Oct. 3, 2019

(30) Foreign Application Priority Data
Mar. 27, 2018    (CN) .......................... 2018 1 0257400

(51) Int. Cl.
*H01L 51/52*    (2006.01)
*H01L 51/56*    (2006.01)

(52) U.S. Cl.
CPC ........ *H01L 51/525* (2013.01); *H01L 51/5246* (2013.01); *H01L 51/5253* (2013.01); *H01L 51/56* (2013.01)

(58) Field of Classification Search
CPC ............... H01L 51/525; H01L 51/5246; H01L 51/5253; H01L 51/56; H01L 51/5237–5259
See application file for complete search history.

(56) References Cited

U.S. PATENT DOCUMENTS

| | | | | |
|---|---|---|---|---|
| 7,147,802 | B2 * | 12/2006 | Sugimoto | ............ C09K 11/595 252/301.4 F |
| 8,038,822 | B2 * | 10/2011 | Kindler | ................ G02B 26/123 156/245 |
| 10,069,105 | B2 | 9/2018 | Hong et al. | |

(Continued)

FOREIGN PATENT DOCUMENTS

| | | |
|---|---|---|
| CN | 1459996 A | 12/2003 |
| CN | 101009318 A | 8/2007 |

(Continued)

OTHER PUBLICATIONS

First Chinese Office Action dated Jun. 27, 2019, received for corresponding Chinese Application No. 201810257400.9.

*Primary Examiner* — Zandra V Smith
*Assistant Examiner* — Jeremy J Joy
(74) *Attorney, Agent, or Firm* — Kinney & Lange, P.A.

(57) ABSTRACT

A packaging method of a display panel, a display panel and an OLED display apparatus are provided. The packaging method includes: forming a dam on a first substrate provided with a component to be packaged, wherein the dam annularly surrounds the component to be packaged, and an intersection angle between an inner side surface of the dam and an upper surface of the first substrate is an acute angle; filling a region surrounded by the dam with a curable liquid; and aligning and assembling a second substrate with the first substrate on which the dam is formed.

19 Claims, 7 Drawing Sheets

(56) References Cited

U.S. PATENT DOCUMENTS

| | | | | |
|---|---|---|---|---|
| 2001/0054867 | A1* | 12/2001 | Kubota | H01L 27/3246 313/504 |
| 2005/0110404 | A1 | 5/2005 | Park et al. | |
| 2007/0172971 | A1* | 7/2007 | Boroson | H01L 51/5246 438/26 |
| 2010/0051992 | A1* | 3/2010 | Kobayashi | H01L 27/3283 257/98 |
| 2010/0090596 | A1* | 4/2010 | Ota | H01L 51/5246 313/512 |
| 2011/0187267 | A1* | 8/2011 | Yamamoto | G02B 5/201 313/504 |
| 2011/0304812 | A1* | 12/2011 | Hwang | G02F 1/133308 349/155 |
| 2013/0248867 | A1* | 9/2013 | Kim | H01L 51/5253 257/59 |
| 2013/0256703 | A1* | 10/2013 | Hsieh | H01L 27/3258 257/88 |
| 2014/0091294 | A1* | 4/2014 | Chen | H01L 51/524 257/40 |
| 2015/0221888 | A1 | 8/2015 | Zhang | |
| 2015/0370391 | A1* | 12/2015 | Chen | G06F 3/0412 345/173 |
| 2016/0013444 | A1 | 1/2016 | Cheng et al. | |
| 2016/0087243 | A1* | 3/2016 | Senoo | H01L 51/5246 257/40 |
| 2016/0285042 | A1* | 9/2016 | Choi | H01L 51/5246 |
| 2016/0293883 | A1* | 10/2016 | Hong | H01L 51/5246 |
| 2016/0293886 | A1 | 10/2016 | Yu et al. | |
| 2017/0141169 | A1* | 5/2017 | Sim | H01L 51/56 |
| 2017/0200916 | A1* | 7/2017 | Shin | H01L 51/56 |
| 2017/0297324 | A1* | 10/2017 | Wang | B41C 1/14 |

FOREIGN PATENT DOCUMENTS

| | | |
|---|---|---|
| CN | 103199199 A | 7/2013 |
| CN | 103456892 A | 12/2013 |
| CN | 103474561 A | 12/2013 |
| CN | 104124268 A | 10/2014 |
| CN | 106057848 A | 10/2016 |

* cited by examiner

DISPLAY PANEL, PACKAGING METHOD THEREOF AND OLED DISPLAY APPARATUS

CROSS-REFERENCE TO RELATED APPLICATION

This application claims the benefit of Chinese Patent Application No. 201810257400.9 filed on Mar. 27, 2018 in the State Intellectual Property Office of China, the whole disclosure of which is incorporated herein by reference.

BACKGROUND

The present disclosure relates to the field of display manufacturing technologies, and in particular to a display panel, a packaging method of a display panel, and an OLED display apparatus.

An organic electroluminescent device (e.g., organic light emitting diode (OLED)) is a display/lighting device that has been developed in recent years. Due to its high response, high contrast, and flexibility, the organic electroluminescent device is considered to have broad application prospects. However, since the organic electroluminescent display device (e.g., OLED display device) may be corroded and damaged under an action of moisture and oxygen, a reliable packaging method is particularly important for the organic electroluminescent display device.

SUMMARY

In one aspect, a packaging method of a display panel includes: forming a dam on a first substrate provided with a component to be packaged, wherein the dam annularly surrounds the component to be packaged, and an intersection angle between an inner side surface of the dam and an upper surface of the first substrate is an acute angle; filling a region surrounded by the dam with a curable liquid; and aligning and assembling a second substrate with the first substrate on which the dam is formed.

Optionally, the packaging method may further include: curing the curable liquid before or after the step of aligning and assembling the second substrate with the first substrate on which the dam is formed.

Optionally, the packaging method may further include: forming a package film on the first substrate provided with the component to be packaged to cover the component to be packaged before the step of forming the dam on the first substrate provided with the component to be packaged.

Optionally, the step of forming the dam on the first substrate provided with the component to be packaged includes: coating the first substrate, on which the packaging film is formed, with a photoresist; exposing and developing the photoresist to form a recessed region in the photoresist, wherein the recessed region surrounds annularly the component to be packaged, and an intersection angle between the upper surface of the first substrate and an inner side surface of the recessed region close to the component to be packaged is the acute angle; filling the recessed region with a liquid adhesive and curing the liquid adhesive to form the dam; and removing the photoresist on the first substrate.

Optionally, the recessed region has a cross section of an inverted trapezoidal shape in a direction which is perpendicular to both the upper surface of the first substrate and the inner side surface of the recessed region.

In another aspect, it is provided a display panel. The display panel may include: a first substrate provided with a component to be packaged; a dam on the first substrate, the dam annularly surrounding the component to be packaged; and a filler in a region surrounded by the dam, wherein the dam has an inner side surface and an outer side surface, the inner side surface being closer to the component to be packaged than the outer side surface; and wherein an intersection angle between the inner side surface of the dam and an upper surface of the first substrate is an acute angle.

Optionally, the display panel may further include a package film disposed on the first substrate and covering the component to be packaged.

Optionally, a cross section of the dam in a direction perpendicular to both the upper surface of the first substrate and the inner side surface of the dam has an inverted trapezoidal shape.

Optionally, a value of the acute angle is related to a material of the filler.

Optionally, the dam includes a cured liquid adhesive.

Optionally, the filler includes a cured transparent liquid adhesive.

Optionally, the transparent liquid adhesive is a UV-curable adhesive or a heat-curable adhesive.

Optionally, a viscosity of the liquid adhesive of the dam is larger than a viscosity of the transparent liquid adhesive of the filler.

Optionally, the dam and the filler include epoxy resin or hexamethyldisiloxane.

Optionally, a content of the epoxy resin in the dam is larger than a content of the epoxy resin in the filler.

Optionally, the filler is formed of a curable hydrophobic liquid.

Optionally, the display panel may further include a second substrate aligned and assembled with the first substrate, and the second substrate together with the dam and the first substrate enclose a closed cavity, both the component to be packaged and the package film are located in the closed cavity, and a remaining region of the closed cavity is filled with the filler.

In a further aspect, it is provided an OLED display apparatus including the display panel as mentioned above, and the component to be packaged is an OLED display device.

Optionally, the OLED display apparatus may further include: a package film on the first substrate and covering the component to be packaged.

Optionally, a cross section of the dam in a direction perpendicular to both the upper surface of the first substrate and the inner side surface of the dam has an inverted trapezoidal shape.

BRIEF DESCRIPTION OF THE DRAWINGS

In order to more clearly explain technical solutions in embodiments of the present disclosure or in the related art, the drawings which is to be used to explain the embodiments of the present disclosure or the related art will be briefly described below. Obviously, the drawings are used to explain only a part of the embodiments of the present disclosure, and other drawings may be obtained by those skilled in the art without any inventive efforts.

DETAILED DESCRIPTION

The technical solutions in embodiments of the present disclosure will be clearly and completely described below with reference to accompanying drawings of the embodiments of the present disclosure. The explicitly described embodiments constitute only some of the embodiments contemplated in view the present disclosure, rather than all of the embodiments. All other embodiments which may be obtained by those skilled in the art based on the embodiments of the present disclosure without any creative works shall be included in the scope of the present disclosure.

Herein, unless otherwise specified, an upper surface of a substrate or a first substrate may refer to a surface of the substrate or the first substrate on a side where a component to be packaged is disposed.

Figure 1:
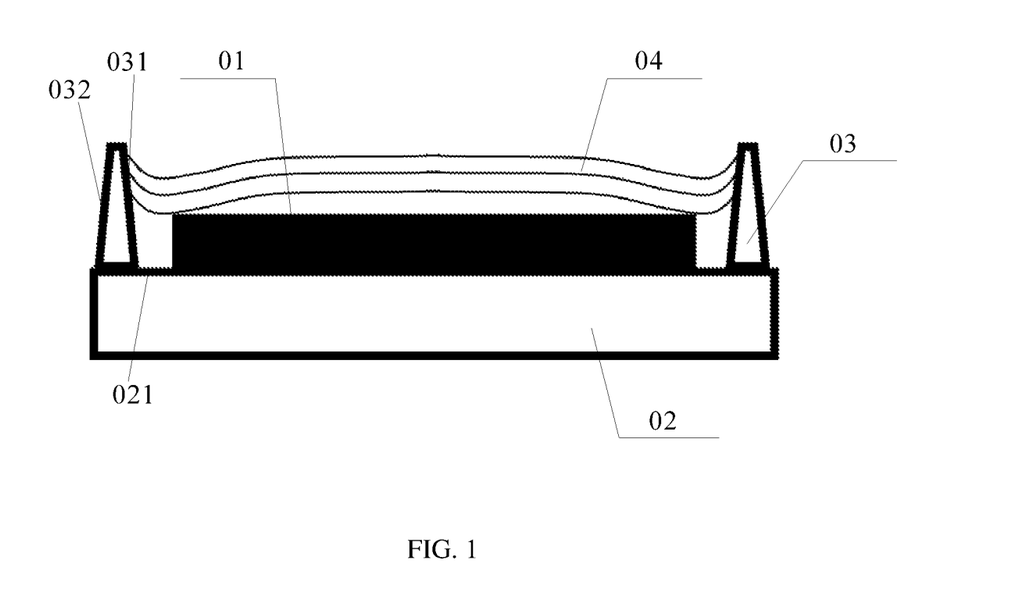
FIG. 1 is a schematic structural view of a display panel.

For example, a packaging structure including a dam and a filler is a kind of packaging manner applied in an OLED display apparatus. Referring to FIG. 1, a dam 03 is provided on a substrate 02 on which an OLED display device 01 is provided. The dam 03 is annularly arranged to surround the OLED display device 01, and then a region surrounded by the dam 03 is filled with a filler 04 which is formed by curing a hydrophobic liquid, so as to block moisture and oxygen from eroding the OLED display device 01. Those skilled in the art will appreciate that the OLED display device may include an anode, a cathode and an OLED functional material layer between the anode and the cathode.

As shown in FIG. 1, the dam 03 has an inner side surface 031 and an outer side surface 032. The inner side surface 031 is closer to the OLED display device 01 than the outer side surface 032. A cross section of the dam 03 in a direction which is substantially perpendicular to the inner side surface 031 thereof and perpendicular to an upper surface 021 (i.e., a surface on which the OLED display device 01 is disposed) of the substrate has a trapezoidal structure. In this way, it may prevent uncured filler 04 from overflowing. As a result, the packaging thickness and region may satisfy design requirements. In an actual packaging process, since the uncured filler 04 has a certain wettability to the dam 03, it will cause the liquid uncured filler 04 to climb along the inner side surface 031 of the trapezoidal dam 03. As a result, an overflow phenomenon may occur even if a total amount of the liquid filler 04 satisfies a design requirement of no overflow, thereby affecting the packaging effect adversely and increasing a risk that the OLED display device 01 may be invaded by moisture and oxygen.

Figure 2A:
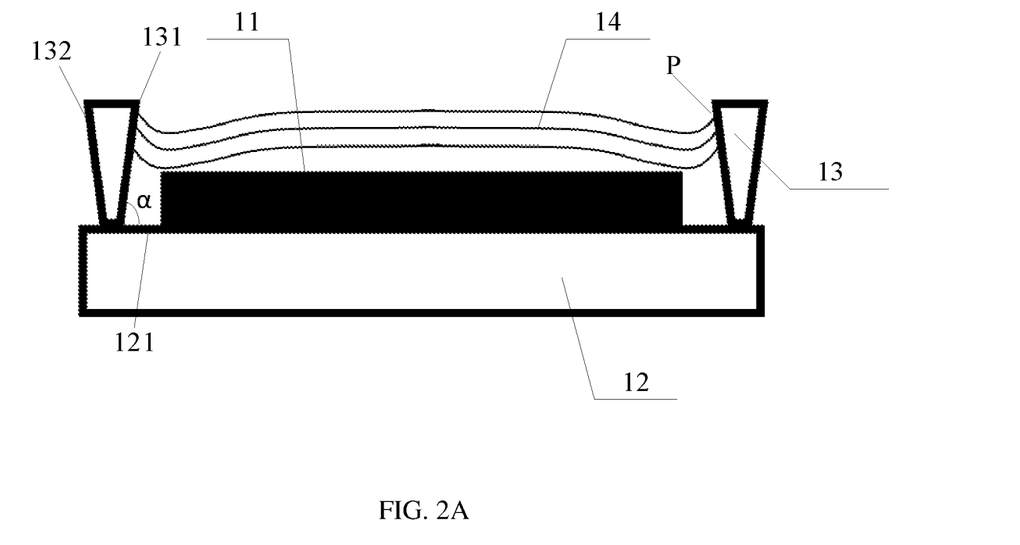
FIG. 2A is a schematic structural view of a display panel according to an embodiment of the present disclosure.
Figure 2B:
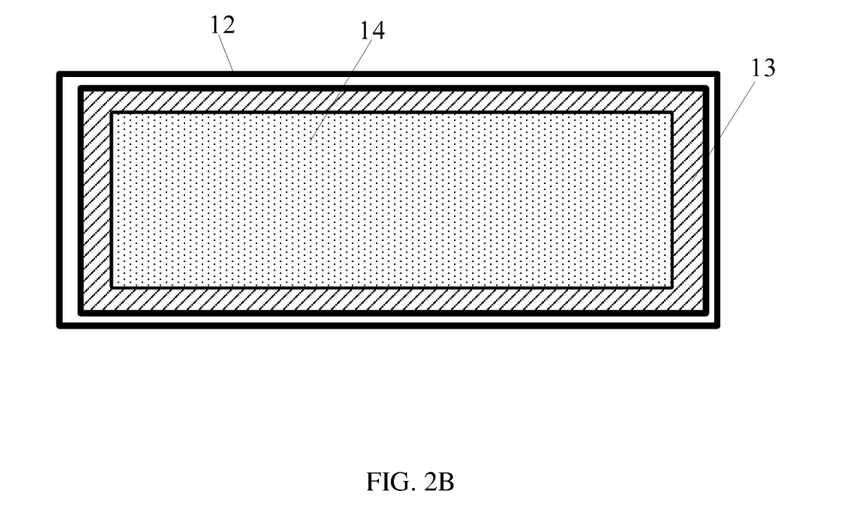
FIG. 2B is a plan view of the display panel illustrated in FIG. 2A.

An embodiment of the present disclosure provides a display panel. As shown in FIG. 2A to FIG. 6, the display panel may include: a first substrate 12 on which a component 11 to be packaged is provided; a dam 13 disposed on the first substrate 12; and a filler 14. The dam 13 is annularly arranged to surround the component 11 to be packaged, as shown in FIG. 2B. A region surrounded by the dam 13 is filled with the filler 14. In an example, the filler 14 may be formed from a curable hydrophobic liquid. As shown in FIG. 2A, the dam 13 has an inner side surface 131 and an outer side surface 132. The inner side surface 131 is closer to the OLED display device 11 than the outer side surface 132. An intersection angle α between the inner side surface 131 of the dam 13 and an upper surface 121 of the first substrate 12 is an acute angle, for example, the intersection angle α may be greater than 0° and less than 90°. In other words, an upper portion of the inner side surface 131 is closer to the OLED display device 11 than a lower portion of the inner side surface 131. That is, as shown, a distance by which the upper portion of the inner side surface 131 is distant from the OLED display device 11 in a direction parallel to the upper surface of the first substrate 12 may be smaller than a distance by which the lower portion of the inner side surface 131 is distant from the OLED display device 11 in the direction parallel to the upper surface of the first substrate 12.

It should be noted that the component 11 to be packaged may be a device that needs to be packaged, which is not limited in the embodiments of the present disclosure. In practical applications, the component 11 to be packaged may be an OLED display device, for example, the OLED display device may include an anode, a cathode and an OLED functional material layer between the anode and the cathode.

Since the intersection angle α between the inner side surface of the dam 13 and the upper surface of the first substrate 12 is an acute angle, an ability by which the filler 14 may climb along the inner side surface 131 of the dam 13 is greatly reduced due to a gravity of the uncured liquid filler 14. Referring to FIG. 2A, an inclination angle of the inner side surface 131 of the dam 13 may be adjusted to adjust an end position P to which the uncured liquid filler 14 may climb finally, so that the packaging effect may be well controlled.

Specifically, as the inclination angle of the inner side surface 131 of the dam 13 becomes larger, that is, as the intersection angle α between the inner side surface 131 of the dam 13 and the upper surface of the first substrate 12 becomes smaller, the end position P to which the uncured liquid filler 14 may climb finally becomes lower, so that the uncured liquid filler 14 is more difficult to overflow from an inner side of the dam 13. In practical applications, a climbing ability of the filler 14 depends on a material of the filler 14, so that the material of the filler 14 may be selected to match with an appropriate inclination angle of the inner side surface of the dam 13, so as to obtain an appropriate climbing ability for the uncured liquid filler 14, thereby obtaining an optimal packaging effect. In other words, the intersection angle α between the inner side surface 131 of the dam 13 and the upper surface of the first substrate 12 is related to the material of the filler 14. By matching the intersection angle α with the material of the filler 14, an appropriate climbing ability for the uncured liquid filler 14 may be obtained, thereby obtaining an optimal packaging effect.

Therefore, in the embodiment of the present disclosure, the intersection angle between the inner side surface of the dam and the upper surface of the first substrate is set to an acute angle, and the climbing ability of the filler is greatly reduced due to the gravity of the uncured liquid filler 14, so that an overflow of the filler due to the climbing phenomenon of the liquid filler may be avoided. In this way, the packaging effect may be improved and the risk that the component to be packaged may be invaded by moisture and oxygen may be reduced, thereby increasing the service life of the OLED display device.

Figure 3:
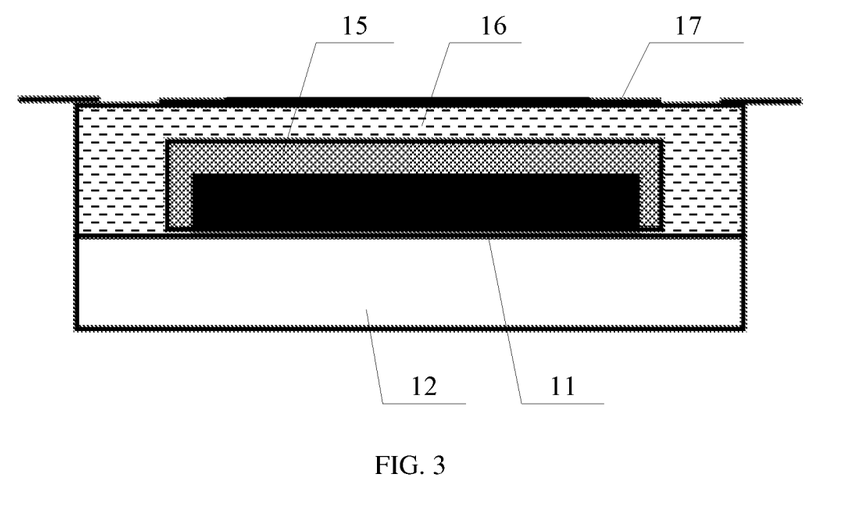
FIG. 3 is a schematic structural view of a display panel according to an embodiment of the present disclosure in a manufacturing process, in which components such as a package film are shown.

Further, as shown in FIG. 3, the display panel may further include a package film 15 which is disposed on the first substrate 12 and covers the component 11 to be packaged.

The package film 15 may be a film packaging the component 11 to be packaged, for example, a protective layer or a passivation layer. The package film 15 may be a high water-resistant film for protecting the component 11 to be packaged, and may be used to prevent moisture and oxygen which are presented in subsequent process of forming the dam 13 and in the uncured filler 14 from invading the component 11 to be packaged.

It should be noted that although an individual package film 15 may block external moisture and oxygen from affecting the component 11 to be packaged, the individual package film 15 has a poor blocking effect. In the embodiment of the present disclosure, the external moisture and oxygen may be further blocked by the filler 14, so that the performance of the component 11 to be packaged may be improved and the service life of the component 11 to be packaged may be extended. In practical applications, the package film 15 may be made of serval types of materials. For example, the package film 15 may be made of a material such as silicon nitride, silicon oxide or the like, which is not specifically limited in the embodiments of the present disclosure.

Further, referring back to FIG. 2A, a cross section of the dam 13 in a direction, which is perpendicular to the upper surface 121 of the first substrate 12 and is substantially perpendicular to the inner side surface 131 of the dam 13, has an inverted trapezoidal shape. More specifically, a cross section of the dam 13 in a direction, which is perpendicular to the upper surface 121 of the first substrate 12 and at the intersection angle α relative to the inner side surface 131 of the dam 13, has an inverted trapezoidal shape.

Figure 4:
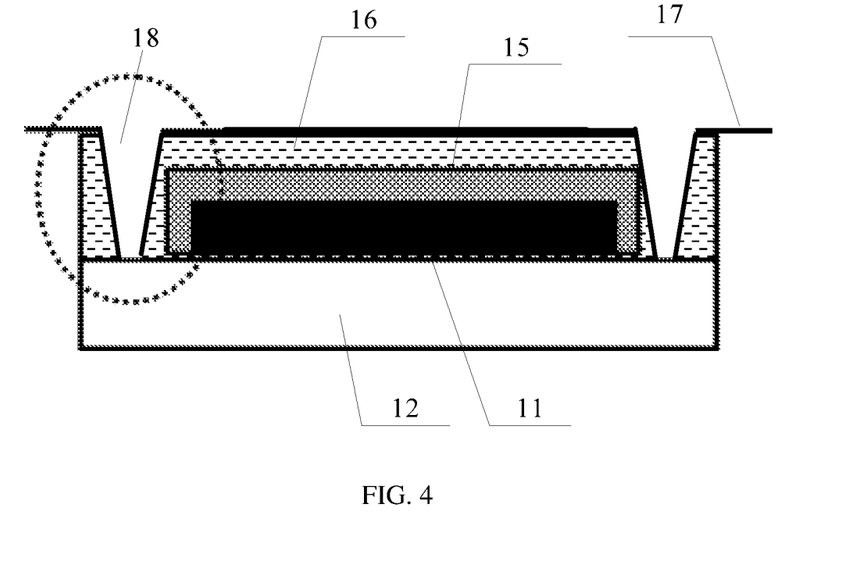
FIG. 4 is a schematic structural view of a display panel according to an embodiment of the present disclosure in a manufacturing process, in which a recessed region is shown.
Figure 5:
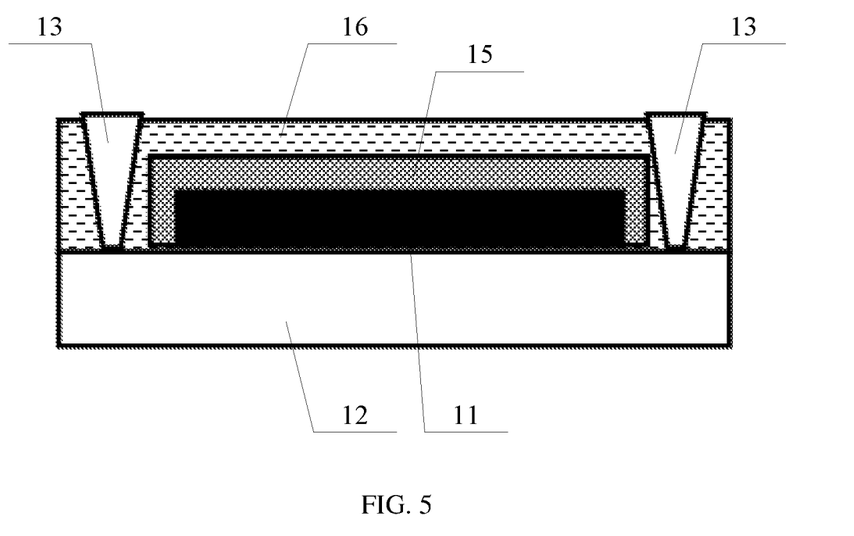
FIG. 5 is a schematic structural view of a display panel according to an embodiment of the present disclosure in a manufacturing process, in which a dam formed by dripping is shown.
Figure 6:
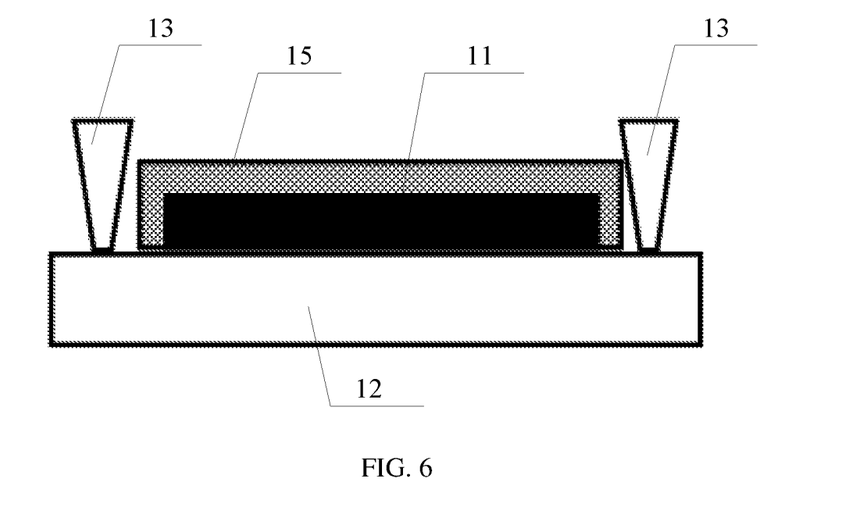
FIG. 6 is a schematic structural view of a display panel according to an embodiment of the present disclosure after stripping a photoresist in a manufacturing process.

In an actual process of forming the dam 13, as shown in FIG. 3, the first substrate 12, on which the component 11 to be packaged (covered by the package film 15) is disposed, is firstly coated with a photoresist 16. The photoresist 16 is then patterned by a mask 17. As shown in FIG. 4, the photoresist 16 is exposed by using the mask 17 and is developed to form a recessed region 18 in the photoresist 16. The recessed region 18 annularly surrounds the component 11 to be packaged. A cross section of the recessed region 18 in a direction, which is perpendicular to both the upper surface 121 of the first substrate 12 and the inner side surface 131 of the recessed region 18, has an inverted trapezoidal shape. More specifically, a cross section of the recessed region 18 in a direction, which is perpendicular to the upper surface 121 of the first substrate 12 and at the intersection angle α with the inner side surface 131 of the recessed region 18, has an inverted trapezoidal shape. As shown in FIG. 4, the inverted trapezoidal recessed region 18 is schematically showed in the dotted circular area. Next, as shown in FIG. 5, liquid adhesive is filled into the recessed region 18 and cured to form the dam 13. Finally, as shown in FIG. 6, the photoresist 16 on the first substrate 12 is removed, as a result, the dam 13 in the inverted trapezoidal shape is formed.

It should be noted that, during the development process, since the photoresist in an exposed area reacts with a developer from top to bottom, an upper portion of the photoresist 16 in the exposed area is in contact with the developer for a relatively long time while a lower portion of the photoresist 16 in the exposed area is in contact with the developer for a relatively short time, so that the recessed region in the inverted trapezoidal shape is formed, as shown in FIG. 4.

In an embodiment of the present disclosure, the liquid adhesive may be filled into the recessed region 18 by dripping.

Figure 9:
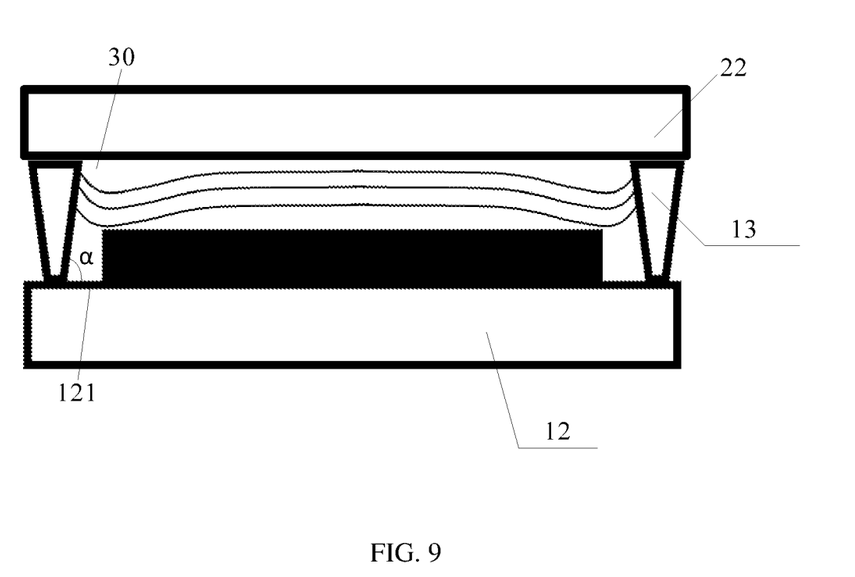
FIG. 9 is a schematic structural view of a display panel according to an embodiment of the present disclosure.

In an embodiment of the present disclosure, the display panel may further include a second substrate 22 that is aligned and assembled with the first substrate 12, as shown in FIG. 9. Referring to FIGS. 6 and 9, the second substrate 22 together with the dam 13 and the first substrate 12 enclose a closed cavity 30. Both the component 11 to be packaged and the package film 15 are located within the enclosed cavity 30, and a remaining region of the enclosed cavity 30 is filled with the filler 14. The filler 14 may block moisture and oxygen from both the second substrate 22 and the dam 13 so as to prevent the component 11 to be packaged from being invaded by moisture and oxygen.

In the embodiment of the present disclosure, specific materials for the dam 13 and the filler 14 are not limited. In general, the dam 13 is formed by curing a liquid adhesive, and the filler 14 is formed by curing a transparent liquid adhesive. The transparent liquid adhesive may specifically be a UV-curable adhesive or a heat-curable adhesive.

Since epoxy resin has good bonding strength and dielectric properties, and is stable to alkali and most solvents, in practical applications, an active component of the materials of the dam 13 and the filler 14 may include epoxy resin. Alternatively, the content of the epoxy resin in the material of the dam 13 may be different form the content of the epoxy resin in the material of the filler 14. The content of the epoxy resin may be adjusted according to different viscosity requirements. As the dam 13 has a different function from the filler 14, the dam 13 requires a large viscosity and a small fluidity while the filler 14 requires a small viscosity and a large fluidity, that is, the viscosity of the liquid adhesive for forming the dam 13 is larger than the viscosity of the liquid adhesive for forming the filler 14, the content of the epoxy resin in the dam 13 may be set to be larger than the content of the epoxy resin in the filler 14.

It should be noted that, in the embodiment of the present disclosure, the dam 13 and the filler 14 may be made of HMDSO (hexamethyldisiloxane) instead of the epoxy resin. A high-performance film made of hexamethyldisiloxane may be deposited at a temperature below 100° C., thereby solving the problem that the OLED material is easily degraded when it is exposed to external environment. Moreover, the dam 13 and/or the filler 14 made of hexamethyldisiloxane may pass an equipment life test and a bending test, and may have high light transmittance and low stress. In addition, the dams 13 and/or the filler 14 made of hexamethyldisiloxane may provide good particle coverage without voids or diffusion channels as there are no high stress points.

A further aspect of the present disclosure provides an OLED display apparatus including the display panel according to any one of the above-mentioned embodiments. The component to be packaged may be an OLED display device.

In the OLED display apparatus, the intersection angle between the inner side surface of the dam and the upper surface of the first substrate is set to an acute angle, and the climbing ability of the liquid filler is greatly reduced due to the gravity of the uncured liquid filler, so that an overflow of the filler due to the climbing phenomenon of the liquid filler may be avoided. In this way, the packaging effect may be improved and the risk that the OLED display device may be invaded by moisture and oxygen may be reduced, thereby increasing the service life of the OLED display apparatus.

Figure 7:
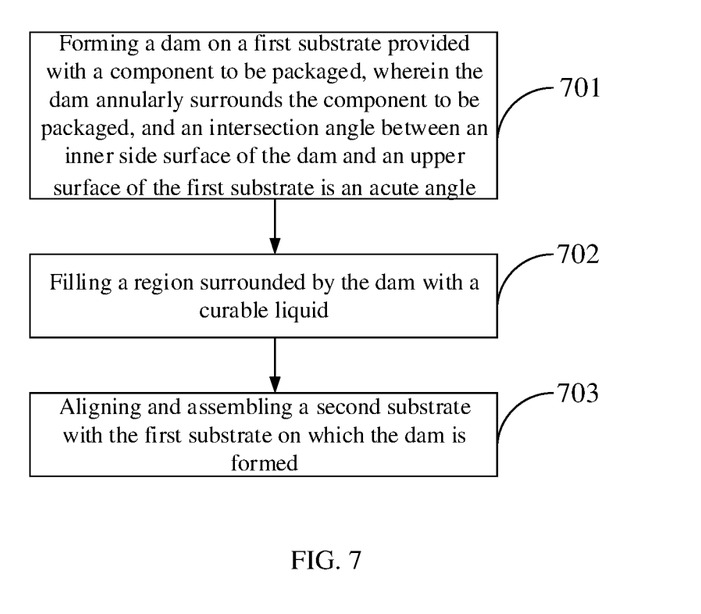
FIG. 7 is a flowchart of a packaging method of a display panel according to an embodiment of the present disclosure.

Another embodiment of the present disclosure provides a packaging method, as shown in FIG. 7, the packaging method may include:

step 701: forming a dam on a first substrate provided with a component to be packaged, wherein the dam annularly surrounds the component to be packaged, and an intersection angle between an inner side surface of the dam and an upper surface of the first substrate is an acute angle;

step 702: filling a region surrounded by the dam with a curable liquid; and step 703: aligning and assembling a second substrate with the first substrate on which the dam is formed.

Optionally, after the step of aligning and assembling the second substrate with the first substrate on which the dam is formed, the packaging method may further include: curing the curable liquid. Alternatively, the step of curing the curable liquid may be performed before the step of aligning and assembling the second substrate with the first substrate on which the dam is formed.

Optionally, before the step of forming the dam on the first substrate provided with the component to be packaged, the packaging method may further include: forming a package film on the first substrate provided with the component to be packaged to cover the component to be packaged.

Figure 8:
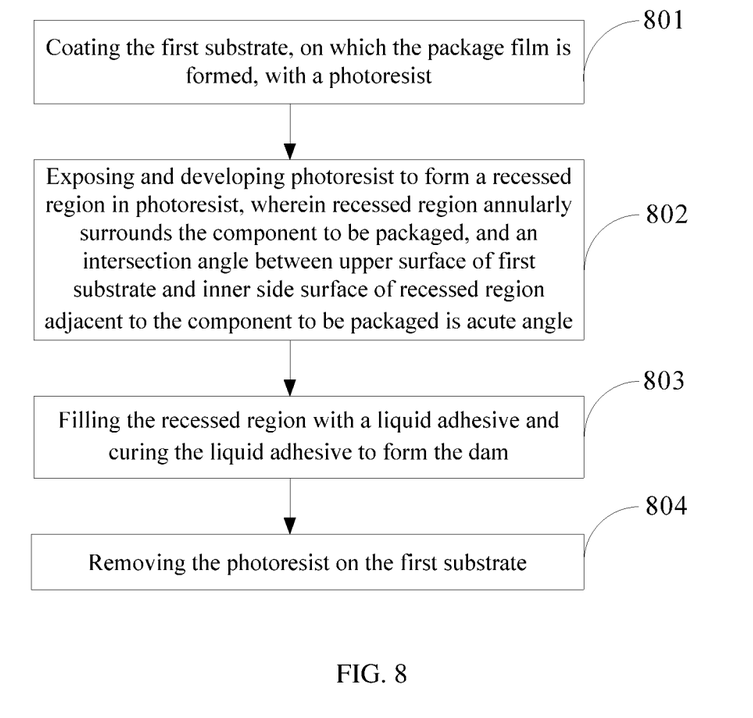
FIG. 8 is a flowchart of a method of forming a dam according to an embodiment of the present disclosure.

As shown in FIG. 8, the step of forming the dam on the first substrate provided with the component to be packaged may specifically include:

step 801: coating the first substrate, on which the package film is formed, with a photoresist.

step 802: exposing and developing the photoresist to form a recessed region in the photoresist, wherein the recessed region annularly surrounds the component to be packaged, and an intersection angle between an upper surface of the first substrate and an inner side surface of the recessed region adjacent to the component to be packaged is the acute angle;

step 803: filling the recessed region with a liquid adhesive and curing the liquid adhesive to form the dam; and step 804: removing the photoresist on the first substrate.

Optionally, as shown in FIG. 4, in the step of exposing and developing the photoresist, a cross section of the recessed region has an inverted trapezoidal shape in a direction which is perpendicular to the upper surface of the first substrate and at the intersection angle relative to the inner side surface of the recessed region.

The steps of the foregoing packaging method may refer to the above descriptions of various parts of the display panel, and details are not described herein again.

The above descriptions are only the specific embodiments of the present disclosure, however, the scope of the present disclosure is not limited thereto. Those skilled in the art can easily think of changes or substitutes within the technical scope of the present disclosure, and all these changes or substitutes may be included in the scope of the present disclosure. Therefore, the scope of the present disclosure should be defined by the scope of the appended claims.

What is claimed is:

1. A packaging method of a display panel, the method comprising:

forming a dam on a first substrate provided with a component to be packaged, wherein the dam annularly surrounds the component to be packaged, and an intersection angle between an inner side surface of the dam and an upper surface of the first substrate is an acute angle;

filling a region surrounded by the dam with a curable liquid; and aligning and assembling a second substrate with the first substrate on which the dam is formed, wherein a value of the acute angle is related to a material of the curable liquid, such that a climbing extent of the curable liquid up the inner side surface of the dam is limited to a predetermined amount based on the value of the acute angle and the material of the curable liquid.

2. The packaging method of claim 1, further comprising: curing the curable liquid before or after the step of aligning and assembling the second substrate with the first substrate on which the dam is formed.

3. The packaging method of claim 1, further comprising: forming a package film on the first substrate provided with the component to be packaged to cover the component to be packaged before the step of forming the dam on the first substrate provided with the component to be packaged.

4. The packaging method of claim 3, wherein the step of forming the dam on the first substrate provided with the component to be packaged comprises:

coating the first substrate, on which the packaging film is formed, with a photoresist;

exposing and developing the photoresist to form a recessed region in the photoresist, wherein the recessed region surrounds annularly the component to be packaged, and an intersection angle between the upper surface of the first substrate and an inner side surface of the recessed region close to the component to be packaged is the acute angle;

filling the recessed region with a liquid adhesive and curing the liquid adhesive to form the dam; and removing the photoresist on the first substrate.

5. The packaging method of claim 4, wherein the recessed region has a cross section of an inverted trapezoidal shape in a direction which is perpendicular to both the upper surface of the first substrate and the inner side surface of the recessed region.

6. A display panel comprising:

a first substrate provided with a component to be packaged;

a dam on the first substrate, the dam annularly surrounding the component to be packaged; and a filler in a region surrounded by the dam, wherein the dam has an inner side surface and an outer side surface, the inner side surface being closer to the component to be packaged than the outer side surface; and wherein an intersection angle between the inner side surface of the dam and an upper surface of the first substrate is an acute angle, and a value of the acute angle is related to a material of the filler, such that a climbing extent of the filler up the inner side surface of the dam is limited to a predetermined amount based on the value of the acute angle and the material of the filler.

7. The display panel of claim 6, further comprising a package film disposed on the first substrate and covering the component to be packaged.

8. The display panel of claim 6, wherein a cross section of the dam in a direction perpendicular to both the upper surface of the first substrate and the inner side surface of the dam has an inverted trapezoidal shape.

9. The display panel of claim 6, wherein the dam comprises a cured liquid adhesive.

10. The display panel of claim 6, wherein the filler comprises a cured transparent liquid adhesive.

11. The display panel of claim 10, wherein the transparent liquid adhesive is a UV-curable adhesive or a heat-curable adhesive.

12. The display panel of claim 10, wherein a viscosity of the liquid adhesive of the dam is larger than a viscosity of the transparent liquid adhesive of the filler.

13. The display panel of claim 6, wherein the dam and the filler comprise epoxy resin or hexamethyldisiloxane.

14. The display panel of claim 13, wherein a content of the epoxy resin in the dam is larger than a content of the epoxy resin in the filler.

15. The display panel of claim 6, wherein the filler is formed of a curable hydrophobic liquid.

16. The display panel of claim 7, further comprising a second substrate aligned and assembled with the first substrate, wherein the second substrate together with the dam and the first substrate enclose a closed cavity, both the component to be packaged and the package film are located in the closed cavity, and a remaining region of the closed cavity is filled with the filler.

17. An OLED display apparatus comprising the display panel of claim 6, wherein the component to be packaged is an OLED display device.

18. The OLED display apparatus of claim 17, further comprising: a package film on the first substrate and covering the component to be packaged.

19. The OLED display apparatus of claim 17, wherein a cross section of the dam in a direction perpendicular to both the upper surface of the first substrate and the inner side surface of the dam has an inverted trapezoidal shape.

* * * * *